United States Patent [19]

Bohnen et al.

[11] Patent Number: 4,915,781
[45] Date of Patent: Apr. 10, 1990

[54] STABILIZED HYDROGEN PEROXIDE COMPOSITIONS

[75] Inventors: Bruce A. Bohnen, Roseville; Kurt E. Heikkila, Circle Pines; Rodney K. Williams, Stacy, all of Minn.

[73] Assignee: E. I. Du Pont de Nemours and Company, Wilmington, Del.

[21] Appl. No.: 224,803

[22] Filed: Jul. 27, 1988

[51] Int. Cl.[4] .................. C09G 13/06; C23G 1/18
[52] U.S. Cl. .................. 156/664; 252/79.2; 252/79.4; 252/186.29; 156/901; 156/666
[58] Field of Search .......... 252/79.1, 79.2, 79.4, 252/186.28, 186.38, 186.29; 156/901, 664, 666

[56] References Cited

U.S. PATENT DOCUMENTS

| | | |
|---|---|---|
| 3,407,141 | 10/1968 | Banush et al. ............ 252/79.4 |
| 3,773,577 | 11/1973 | Shibasaki et al. ............ 156/8 |
| 3,957,428 | 5/1976 | Massey et al. ............ 252/186.26 |
| 3,974,086 | 8/1976 | Rauhut et al. ............ 252/186.29 |
| 4,027,008 | 5/1977 | Sokol ............ 252/186.38 |
| 4,086,176 | 4/1978 | Ericson et al. ............ 252/79.4 |
| 4,141,850 | 2/1979 | Readio ............ 252/186.29 |
| 4,233,111 | 11/1980 | Valayil et al. ............ 156/666 |
| 4,233,113 | 11/1980 | Valayil et al. ............ 252/79.4 |
| 4,236,957 | 12/1980 | Valayil et al. ............ 252/79.4 |
| 4,251,384 | 2/1981 | Rooney ............ 252/79.4 |
| 4,437,930 | 3/1984 | Wong ............ 252/79.4 |
| 4,437,931 | 3/1984 | Elias ............ 252/79.4 |
| 4,462,861 | 7/1984 | McClean ............ 252/79.4 |
| 4,636,282 | 1/1987 | Wong ............ 252/79.2 |
| 4,704,404 | 11/1987 | Sanderson ............ 252/186.28 |
| 4,735,740 | 4/1988 | Zielske ............ 252/186.38 |
| 4,744,918 | 5/1988 | Malin et al. ............ 252/186.29 |
| 4,770,808 | 9/1988 | McDonogh et al. ............ 252/186.28 |

Primary Examiner—David L. Lacey
Assistant Examiner—L. Johnson

[57] ABSTRACT

The present invention is directed to a hydrogen peroxide solution stabilized by

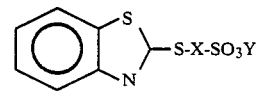

wherein X is a linking group and Y is a metal cation or H which compound is soluble in hydrogen peroxide. In the second aspect of of the invention, a stabilized hydrogen peroxide solution contains a mineral acid which is suitable for etching a metal surface of a metal substrate such as a printed wiring board.

14 Claims, No Drawings

STABILIZED HYDROGEN PEROXIDE COMPOSITIONS

FIELD OF THE INVENTION

The invention relates to aqueous solutions containing hydrogen peroxide. A first aspect of the invention is an aqueous hydrogen peroxide composition comprising hydrogen peroxide stabilized by an organic stabilizer. A second aspect of the invention is an aqueous hydrogen peroxide-containing chemical etchant composition, useful in the manufacture of printed wiring boards, comprising hydrogen peroxide, an organic stabilizer and a strong mineral acid.

BACKGROUND OF THE INVENTION

Hydrogen peroxide, $H_2O_2$, is a commodity chemical used in many industrial processes. Hydrogen peroxide has been commercially available since the middle of the 19th Century in the form of aqueous solutions of hydrogen peroxide within broad concentration ranges, typically between 1 and 80 weight percent, and can be as concentrated as 96 weight percent. The major chemical properties and uses of hydrogen peroxide result from its structure which includes a covalent oxygen-oxygen (peroxy oxygen) high energy-bond. The high energy peroxy bond provides the chemical driving force that makes hydrogen peroxide useful in many chemical processes. More particularly, hydrogen peroxide is used in a variety of organic and inorganic oxidation reactions, and can be used to make a variety of other organic and inorganic peroxy compounds. An important use for hydrogen peroxide is in the dissolution of metal, typically copper, from a masked printed wiring board substrate to form a final wiring pattern. Typically the aqueous hydrogen peroxide etchant compositions comprise in an aqueous solution, an active amount of hydrogen peroxide, a strong mineral acid and an organic stabilizer.

While the high energy peroxy bond of hydrogen peroxide provides a chemical driving force useful to chemists, the high energy bond can also result in (1) the tendency of hydrogen peroxide to decompose into water, $H_2O$ and oxygen gas, $O_2$, and (2) the tendency to oxidize organic compounds in the peroxide solutions. Highly pure hydrogen peroxide in a suitable inert container is relatively stable. However, commonly available industrial grades of hydrogen peroxide are typically contaminated during manufacture, transfer, storage and use by chemical impurities that can catalyze or at least support decomposition. The most common decomposition catalysts comprise di- or tri-valent metal ions. Stabilizers have been developed and are now commonly used to reduce decomposition to the lowest achievable level by minimizing the effect of the impurities. Examples of known stabilizing agents are 8-hydroxyquinoline, sodium pyrophosphate, stannic acid, sulfolene, sulfolane, sulfoxide, sulfone, dialkylaminothioxomethyl, thioalkylsulfonic acids, aliphatic amines, benzotriazole, nitro-substituted organic compounds such as nitrobenzene sulfonic acids, thiosulfate, and others. Such stabilizers are known in a number of prior art publications.

Banush et al., U.S. Pat. No. 3,407,141, discloses an acid-hydrogen peroxide etchant solution containing an additive selected from the group consisting of phenyl urea, diphenyl urea, benzoic acid, hydroxybenzoic acid, and salts and mixtures thereof. Banush et al., further discloses that the etch rates and capacity of the solution are improved by adding a small amount of an additive such as sulfurthioazol.

Shibasaki et al., U.S. Pat. No. 3,773,577, discloses a sulfuric acid, hydrogen peroxide etchant solution containing an additive such as benzotriazol.

Valayil et al., U.S. Pat. No. 4,233,111, discloses a sulfuric acid, hydrogen peroxide etchant solution containing a catalytic amount of 3-sulfopropyldithiocarbamate sodium salt having the general formula

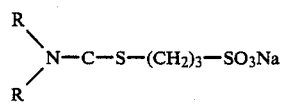

wherein R can be a $C_1$-$C_4$ alkyl, a phenyl, a $C_7$-$C_{10}$ alkaryl or a $C_7$-$C_{10}$ aralkyl.

As an etchant for the manufacture of printed wiring boards, aqueous hydrogen peroxide solutions are attractive because hydrogen peroxide solutions are relatively easily handled, have high activity and low cost. However, hydrogen peroxide metal etching compositions can be subject to numerous problems and pitfalls. Since large amounts of metallic ions are generated during etching, the metallic ions can promote rapid hydrogen peroxide decomposition, thus destroying substantial proportions of the hydrogen peroxide that should economically be used directly in the removal of metal from printed wiring board circuits. Etchants that can be stabilized, during storage and use, from substantial decomposition of hydrogen peroxide are desirable for convenient and effective etchant processes. Further, the etchant compositions should be stabilized from loss of the organic stabilizers. Still further, the rate of etching using hydrogen peroxide etchants can be accelerated using organic promoters.

BRIEF DESCRIPTION OF THE INVENTION

Useful hydrogen peroxide solutions, including bulk hydrogen peroxide comprising a major proportion of hydrogen peroxide and aqueous working solutions of hydrogen peroxide, such as those used in etching printed wiring boards, can be stabilized to preserve the active concentrations of hydrogen peroxide and an additional organic stabilizer, if present, in solution by incorporating in such solutions an effective amount of an organic stabilizer additive comprising a sulfonic acid compound. After preparation, solutions containing such an additive composition exhibit exceptional storage life without substantial peroxide or stabilizer depletion over extended periods. Further, such solutions, containing such additives, effectively and efficiently etch metals including copper at high rates, high capacity, and have a long, active, useful etching life. It has further been found that combining other organic stabilizer compounds with an effective amount of the sulfonic acid compound in the peroxide solutions provides an added degree of protection against peroxide decomposition. The particularly preferred solutions of the invention comprise hydrogen peroxide and an effective combination of a 3-(benzothiazoyl-2-thio)alkylene sulfonic acid compound in combination with sulfanilic acid compound.

SUMMARY OF THE INVENTION

The present invention is directed to a hydrogen peroxide solution stabilized by a compound of the following formula:

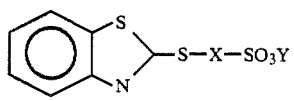

FORMULA 1 wherein X is a linking group and Y is a metal cation or H which compound is soluble in hydrogen peroxide. A preferred linking group of Formula I is a substituted alkyl wherein the alkyl moiety contains 1 to 13 carbon atoms such as

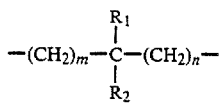

Formula II wherein $R_1$ and $R_2$ independently of the other are H or $C_{1-9}$ alkyl or a $C_5$ or $C_6$ saturated or unsaturated cyclic group and m and n independently of the other are an integer of 0 to 9, with the proviso the sum of m and n is not greater than 12.

In a second aspect of the invention, the stabilized hydrogen peroxide solution contains a mineral acid which is suitable for etching a surface of a substrate such as a printed wiring board.

DETAILED DESCRIPTION OF THE INVENTION

Hydrogen peroxide solutions in bulk storage can comprise concentrations of hydrogen peroxide that range from about 30 to about 95 weight percent. Typically, such bulk hydrogen peroxide solutions contain an effective amount comprising about 0.01 to about 5 weight percent of an organic stabilizer and the balance typically comprises water. In use typically such bulk hydrogen peroxide solutions are diluted. Water, solvents, and other chemical compositions can be added to the hydrogen peroxide solution in order to create a working peroxide composition.

In the present invention, an organic stabilizer is replaced at least partially by an organic stabilizer of Formula 1 referred to under the Summary of the Invention. In such Formula 1, it is considered that Y is ordinarily present as hydrogen rather than an metal cation, but the cation form, e.g., a salt, can be introduced as a starting material. A preferred linking group of Formula I, i.e., X, is a substituted alkyl wherein the alkyl moiety contains 1 to 13 carbon atoms. A more preferred linking group is presented in Formula II wherein $R_1$ and $R_2$ groups are hydrogen or $C_1$ to $C_4$ alkyl such as propyl and where $R_1$ and $R_2$ are the same. Preferred m and n groups are identical and are 4 or less.

Examples of the organic stabilizer compounds include benzothiazoyl-2-thiomethylene sulfonic acid, 2-(benzothiazoyl-2-thio)ethylene sulfonic acid sodium salt, 3-(benzothiazoyl-2-thio)propylene sulfonic acid potassium salt, 12-(benzothiazoyl-2-thio)dodecylene sulfonic acid, 3-(benzothiazoyl-2-thio)-(2-methyl)propylene sulfonic acid, 4-(benzothiazoyl-2-thio)cyclohexylene sulfonic acid.

Since the Formula 1 compound functions to stabilize the hydrogen peroxide, that is reduce its rate of decomposition, the additive should be soluble in the hydrogen peroxide at the concentration employed. The concentration of Formula 1 additive is not considered critical and illustratively is in the range of prior art stabilizers, for example 0.01 to about 5 weight percent on the basis of hydrogen peroxide, water, and the Formula 1 stabilizer. For purposes of cost it may be desirable to introduce a second lower cost stabilizer such as one known in the prior art. An example of preferred stabilizer is a sulfanilic acid compound of the following formula:

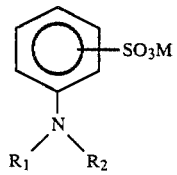

wherein R1 and R2 independently of the other comprises hydrogen or a $C_{1-10}$ linear or branched chain alkyl group wherein R1 and R2 independently of the other comprises hydrogen or a $C_{1-10}$ linear or branched chain alkyl group and M is hydrogen or a metallic cation such as sodium potassium, calcium, copper. Sulfanilic acid, wherein each R is hydrogen (aminobenzenesulfonic acid), is the preferred co-additive.

An etching solution can contain in a major proportion of water, an effective etching amount of hydrogen peroxide, a strong mineral acid such as sulfuric acid and the organic stabilizer composition of this invention.

Strong mineral acids that can be used in the etchant compositions of the invention include sulfuric acid, nitric acid, hydrochloric acid, hydrofluoric acid, and fluoroboric acid.

While these solutions are particularly useful in the chemical dissolution or etching of copper and copper alloys, other metals and alloys may also be dissolved with the chemical action of the solutions, for example iron, nickel, zinc, lead, or tin.

The etchant solutions of the invention can be made by diluting the hydrogen peroxide bulk solutions of the invention to the appropriate hydrogen peroxide concentration in typically aqueous media and adding another necessary etchant compound such as the mineral acid.

Solvents which are useful in maintaining the organic stabilizer of the invention in solutions include solvents which are soluble in water and which promote the solubility of the organic stabilizers of the invention. Typically solvents useful in this invention include oxygenated solvents and other highly polar solvents having high dipole moments. Particular examples of useful solvents include methanol, ethanol, isopropanol, tetrahydrofuran, dimethylformamide, dimethylsulfoxide, and others.

In use the etchant solutions of the invention are formulated to dissolve metal, commonly copper, at conventional etching conditions. The etchants of this invention can be used in an environment in which chemical metal removal is useful. Most commonly such etching processes are used in the manufacture of printed wiring (printed circuit) boards.

In the manufacture of such printed wiring boards, a photosensitive resist is applied to a metal clad board or a laminate for multi-layered boards. The board is masked and exposed to electromagnetic radiation of an appropriate wave length for the resist. The use of the mask protects certain resist areas from the effects of the light. In areas not protected by the mask, the radiation typically causes the photoresist to crosslink or polymerize, rendering the resist more chemically insoluble. Positive resists can also be used with an appropriate mask. Typically the exposed resist remains on the board while the unexposed resist can easily be removed by a chemical rinse. After removal, the resist exposes unwanted areas of metal to chemical etching.

Typically the metal is etched at temperatures that range between about 105 degrees to about 200 degrees Fahrenheit, and preferably for ease of operation 110 degrees to 140 degrees Fahrenheit. The solutions of this invention have sufficient activity for use in either immersion or spray etching techniques. Etch rates obtained using the composition of the invention can range from about 1 to 2 ounces of copper per square foot per minute. After etching, the printed circuit board is typically rinsed with water, the photoresist removed, and a single or double sided printed circuit board is directed to an assembly station.

To further illustrate the present invention the following examples are provided.

EXAMPLE

Into a 2-liter glass beaker equipped with a magnetic stirrer was added 600 milliliters of deionized water. Stirring was initiated and into the deionized water was added 150 milliliters of 15 weight percent aqueous sulfuric acid. The mixture was agitated until uniform and into the stirred aqueous solution was added 50 milliliters of 50 weight percent active aqueous hydrogen peroxide. Into the aqueous bath was placed 75 grams of copper sulfate pentahydrate ($CuSO_4.5H_2O$) and one of the following:

(I) 0.75 grams of 3-(benzothiazoyl-2-thio)propylene sulfonic acid (II) 0.25 grams of 3-(benzothiazoyl-2-thio)propyl sulfonic acid sodium salt and 0.5 grams of sulfanilic acid.

When uniformity in mixing was obtained, additional water was added to reach a total volume of 1,000 milliliters.

The 1 liter etchant baths of the Example were heated to 50 degrees Centigrade in a water tank heater. The solutions were maintained at this temperature for 49 hours and the concentration of the hydrogen peroxide and the concentration of the organic stabilizer was monitored. The following Table sets forth the change in peroxide concentration. Additionally, the stabilizer concentration was measured after 49 hours to determine if the concentration of stabilizer had decreased due to decomposition.

TABLE

| Stabilizer | Decrease in $H_2O_2$ (g/L) | | Change in 3-(benzylthiozoyl)-2-thio)propylene (mM) Units |
|---|---|---|---|
| | 31.5 Hrs | 49.0 Hrs | 49.0 Hrs |
| I | 1.03 | 1.98 | — |
| II | — | 5.5 | 0.57 | g/L means grams per liter
mM means millimoles

What is claimed is:

1. A stabilized hydrogen peroxide composition comprising hydrogen peroxide and a compound of the following formula:

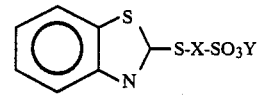

wherein X is a linking group and Y is a metal cation or H which compound is soluble in hydrogen peroxide.

2. The composition of claim 1 wherein X is a substituted alkyl wherein the alkyl moiety contains 1 to 13 carbon atoms.

3. The composition of claim 1 wherein X is of the formula:

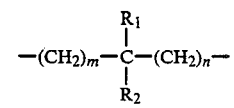

wherein $R_1$ and $R_2$ independently of the other are H or $C_{1-9}$ alkyl or a $C_5$ or $C_6$ saturated or unsaturated cyclic group and m and n independently of the other are an integer of 0 to 9 with the proviso the sum of m and n is not greater than 12.

4. The composition of claim 3 wherein $R_1$ and $R_2$ are the same and are H or a $C_1$-$C_4$ alkyl.

5. The composition of claim 1 wherein Y is hydrogen.

6. The composition of claim 3 wherein Y is hydrogen.

7. The composition of claim 1 which contain a sulfanilic acid compound.

8. An aqueous chemical etchant composition which comprises:
(a) water
(b) hydrogen peroxide
(c) mineral acid
(d) a compound of the formula:

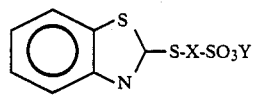

wherein X is a linking group and Y is a metal cation which compound is soluble in hydrogen peroxide.

9. The composition of claim 8 wherein X is a substituted alkyl moiety wherein the alkyl moiety contains 1 to 13 carbon atoms.

10. The composition of claim 8 wherein X is of the formula

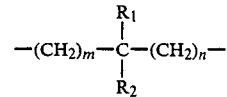

wherein $R_1$ and $R_2$ independently of the other are H or $C_{1-9}$ alkyl or a $C_5$ or $C_6$ saturated or unsaturated cyclic group and m and n independently of the other are an integer of 1 to 9 with the proviso the sum of m and n is not greater than 12.

11. The composition of claim 10 wherein $R_1$ and $R_2$ are the same and are H or $C_1$-$C_4$ alkyl.

12. The composition of claim 8 wherein Y is hydrogen.

13. The composition of claim 10 wherein Y is hydrogen.

14. A method of etching a surface containing metal comprising etching a surface containing a metal portion with a composition which comprises:
(a) water
(b) hydrogen peroxide
(c) mineral acid
(d) and a compound of the formula

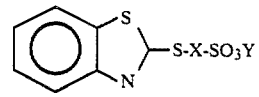

wherein X is a linking group and Y is a metal cation or H which compound is soluble in hydrogen peroxide.

* * * * *